United States Patent [19]

Koui

[11] Patent Number: 5,918,109
[45] Date of Patent: Jun. 29, 1999

[54] METHOD FOR MAKING OPTICAL SEMICONDUCTOR ELEMENT

[75] Inventor: Tomoaki Koui, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/605,673

[22] Filed: Feb. 22, 1996

[30] Foreign Application Priority Data

Feb. 22, 1995 [JP] Japan .................................... 7-056791

[51] Int. Cl.⁶ .................................................. H01L 21/00
[52] U.S. Cl. ............................................... 438/31; 438/39
[58] Field of Search ................................. 438/39, 40, 31, 438/41; 372/45

[56] References Cited

U.S. PATENT DOCUMENTS

| | | | |
|---|---|---|---|
| 4,852,116 | 7/1989 | Takiguchi et al. | 372/45 |
| 5,479,427 | 12/1995 | Yoshida et al. | 372/45 |
| 5,524,017 | 6/1996 | Endo | 372/45 |
| 5,543,957 | 8/1996 | Koui et al. | 359/245 |
| 5,614,436 | 3/1997 | Shim et al. | 437/129 |

FOREIGN PATENT DOCUMENTS

A0454476 10/1991 European Pat. Off. .

| | | |
|---|---|---|
| 64-7586 | 1/1989 | Japan . |
| 4-303982 | of 1992 | Japan . |
| 6-314657 | 11/1994 | Japan . |
| 7-176829 | 7/1995 | Japan . |

OTHER PUBLICATIONS

1991 Denshi Joho Tsushin Gakkai Shukki Daikai C–133, p. 4–163, Sep. 1991 (No translation).

Pp. 153 to 154 of "Electronics Letters", 16th Jan. 1992, vol. 28, No.2.

Pp. 8 to 9 of "OFC" Technical Digest (1994) DFB–LD/modulator integrated light sources fabricated by band–gap––energy–controlled selective MOVPE with stable fiber––transmission characteristics.

*Primary Examiner*—Brian Dutton
*Attorney, Agent, or Firm*—Sughrue, Mion, Zinn, Macpeak & Seas, PLLC

[57] ABSTRACT

A method for making an optical semiconductor element including the steps of: forming two growth-blocking mask stripes of silicon dioxide film on a first conductivity type compound semiconductor substrate; selectively forming a double-heterostructure which comprises a first conductivity type cladding layer, a light absorption layer and a second conductivity type cladding layer on a mask opening region by the metal organic vapor phase epitaxy method; partially removing the mask stripes on both sides of the double-heterostructure and opposite sides of the mask stripes thereof to provide further opening regions; and selectively forming a burying structure on the double-heterostructure by the metal organic vapor phase epitaxy method.

6 Claims, 9 Drawing Sheets

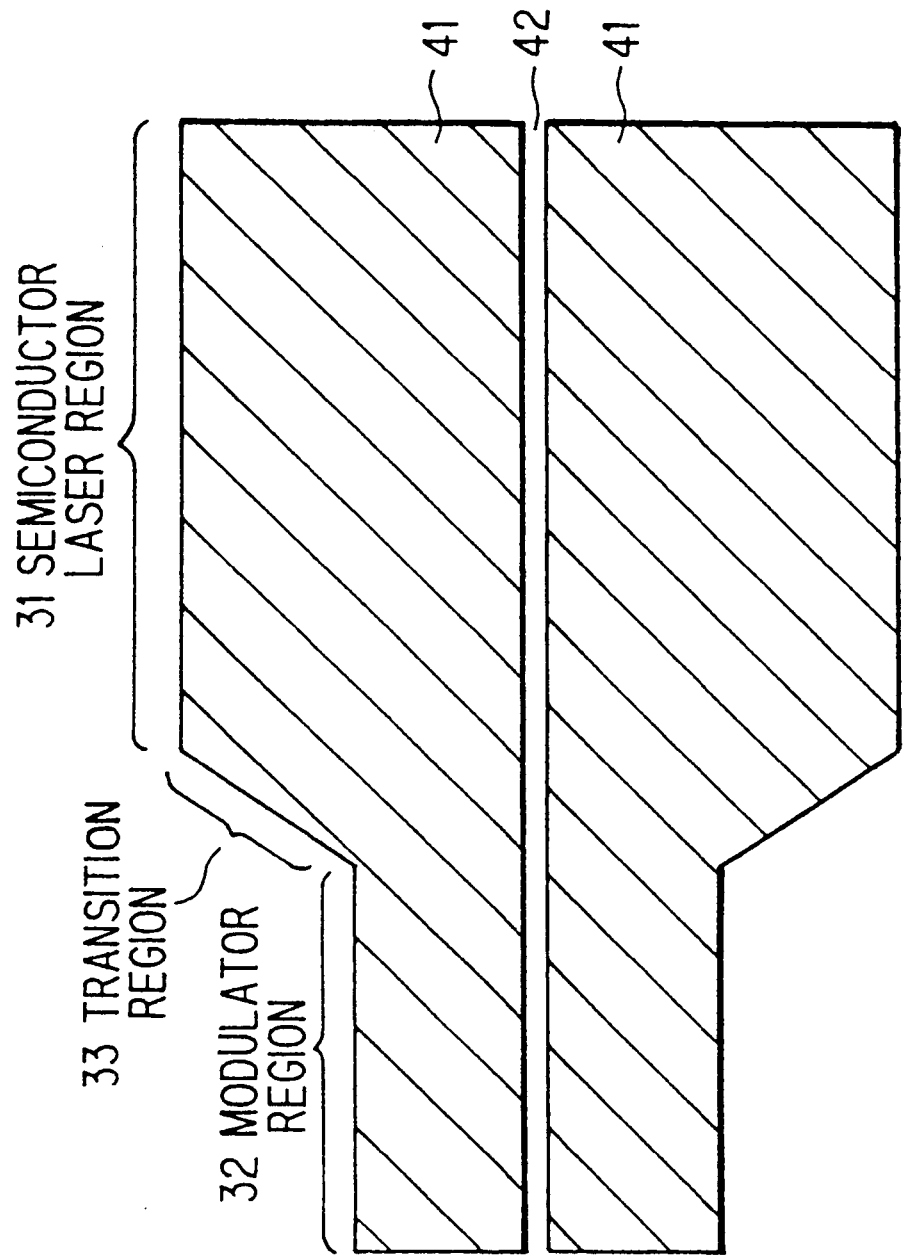

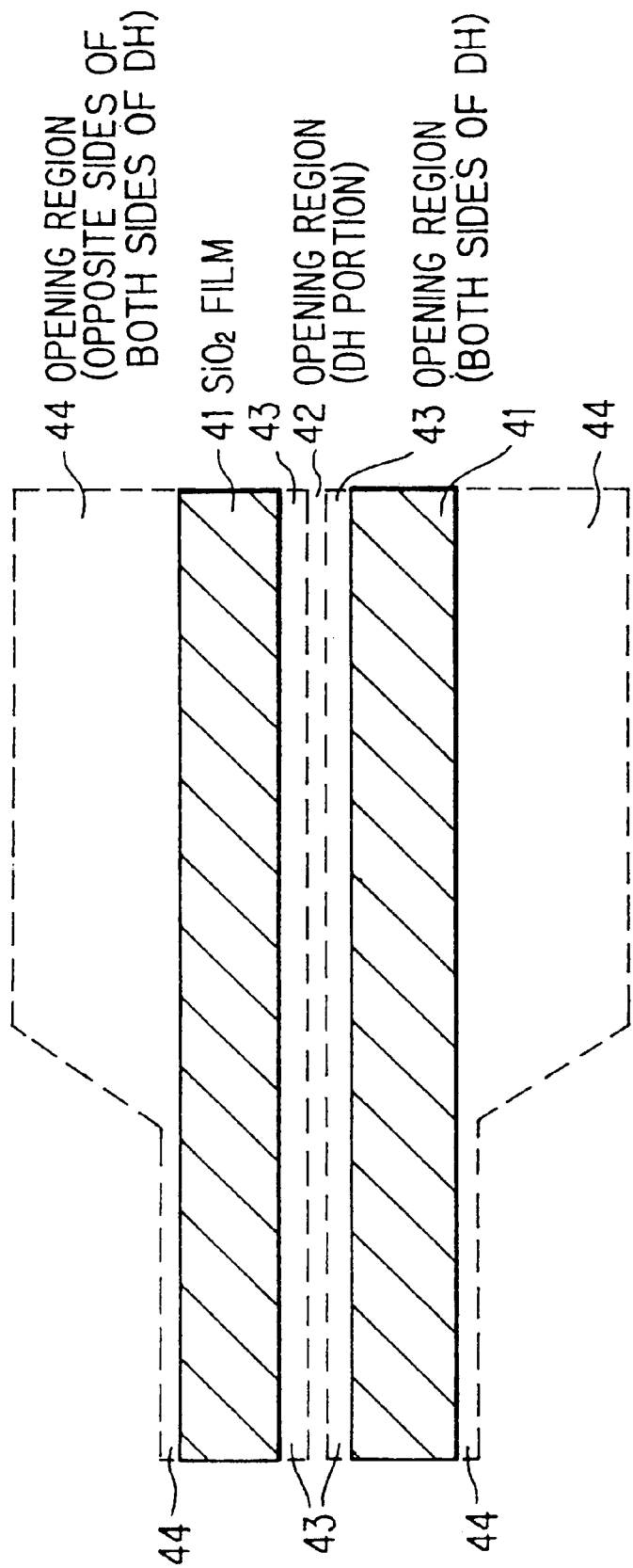

- 112 DIFFRACTION GRATING
- 113 SiO₂ MASK
- 111 n-InP SUBSTRATE
- 113
- 114 OPENING REGION

- 124 DH PORTION
- 113
- 111

- 124
- 123 p-InP CLADDING LAYER
- 122 InGaAsP-SCH LAYER
- 121 InGaAsP-SCH LAYER
- 119 InGaAsP BARRIER LAYER ⎫ 120
- 118 InGaAsP WELL LAYER ⎭
- 120 MULTIQUANTUM WELL
- 119
- 118
- 119
- 117 InGaAsP-SCH LAYER
- 116 n-InP SPACER
- 115 n-InGaAsP GUIDING LAYER

METHOD FOR MAKING OPTICAL SEMICONDUCTOR ELEMENT

FIELD OF THE INVENTION

This invention relates to a method for making an optical semiconductor element, and more particularly to, a method for making an optical semiconductor element in which a double-heterostructure (DH) portion and a burying portion are formed by the metal organic vapour phase epitaxy (MOVPE) method.

BACKGROUND OF THE INVENTION

An ultra high-speed transmission system more than 1 Gbit/sec using optical communication techniques has been rapidly developed. An external modulation manner for realizing high-speed responsibility and long distance transmission, for example, a semiconductor optical modulator, has been also developed. Furthermore, an optical semiconductor element integrating a semiconductor laser and optical modulator has been researched.

Such an optical semiconductor element may be effectively fabricated by using the selective growth technique by the MOVPE method. For example, Japanese patent application laid-open No.4-303982 discloses a selective MOVPE method in which the etching for a substrate and a growing layer is not used. Conventionally, when the waveguide width of a growth is controlled by mesa-etching, the mesa width can not be sufficiently controlled by the etching, thereby causing a dispersion in the wafer. On the contrary, in the selective MOVPE method, the mesa width can be easily controlled by changing the width of a mask for blocking the growth and the damage to a substrate and growing layer due to the etching can be avoided to improve the uniformity of an element.

However, in Japanese patent application laid-open No.4-303982, where a device portion is provided on a burying layer grown by the selective MOVPE method from opening regions at both sides of a double-heterostructure (DH), the film thickness of the regions outside the device portion is greater than that of the device portion. This is caused by the fact that the burying layer on the regions outside the device portion is grown from a mesa portion already formed.

Therefore, it is difficult for the glass mask used in the process (the contact exposure technique) of forming electrodes on the device portion to be contacted with the device portion since the outside regions first contact the glass mask. As a result, a mask pattern is not securely transferred to the device portion, thereby failing to remove a coated resist in the form of a stripe, i.e., resulting in "removal failure".

To overcome the above problem, the film thickness of the outside regions should be thinner than that of the device portion to closely contact the glass mask with the device portion. For example, Japanese patent application laid-open No.01-007586 discloses a method for making an optical semiconductor element in which a difference in film thickness is provided before the growth of a burying layer. In this method, a double channel planar burying heterostructure (DC-PBH structure) laser is fabricated only by the MOVPE method. Namely, when the method in Japanese patent application laid-open No.01-007586 is combined with the above problem in Japanese patent application laid-open No.4-303982, the regions outside the device portion will be suitably etched off before the growth of the burying layer.

However, since in such a combined method the growing layer has to be etched off, the advantage of the selective MOVPE technique that a substrate is not damaged by etching and the product yield is thereby improved, is substantially lost. Furthermore, in the combined method, the number of process steps for making an optical semiconductor element is undesirably increased.

SUMMARY OF THE INVENTION

Accordingly, it is an object of the invention to provide a method for making an optical semiconductor element by which a substrate is not damaged by etching and the product yield is thereby improved.

According to the invention, a method for making an optical semiconductor element, comprises the steps of:

forming two growth-blocking mask stripes of silicon dioxide film on a first conductivity type compound semiconductor substrate;

selectively forming a double-heterostructure which comprises a first conductivity type cladding layer, a light absorption layer and a second conductivity type cladding layer on a mask opening region by the metal organic vapour phase epitaxy method;

partially removing mask stripes on both sides of the double-heterostructure and opposite sides thereof to provide opening regions; and selectively forming a burying structure on the double-heterostructure by a metal organic vapour phase epitaxy method.

According to another aspect of the invention, a method for making an optical semiconductor element, comprises the steps of:

forming two growth-blocking mask stripes of silicon dioxide film which comprise longitudinally a first width region, a second width region with a width greater than the first width region and a tapered third width region extending between the first and second width regions on a first conductivity type compound semiconductor substrate;

selectively forming a double-heterostructure which comprises a first conductivity type cladding layer, a light absorption layer and a second conductivity type cladding layer on an mask opening region by the metal organic vapour phase epitaxy method;

partially removing the mask stripes on both sides of the double-heterostructure and opposite sides thereof to provide opening regions;

selectively forming a burying structure on the double-heterostructure by the metal organic vapour phase epitaxy method; and forming an electrodes on the burying structure by the contact exposure method.

In accordance with the invention, the mask stripes on both sides of the double-heterostructure and opposite sides thereof are partially removed to provide opening regions and the burying layer is selectively grown by the metal organic vapour phase epitaxy method. Thereby, the film thickness of the region outside the double-heterostructure is kept less than that of the double-heterostructure. Furthermore, the advantage of the selective MOVPE technique is obtained that a substrate is not damaged by etching and the product yield is thereby improved. Also, the number of process steps for making an optical semiconductor element can be decreased, thereby decreasing the total work time.

BRIEF DESCRIPTION OF THE DRAWINGS

The invention will be explained in more detail in conjunction with the appended drawings, wherein:

FIGS. 7A to 7B are plan views showing silicon dioxide film patterns used in the method in the second preferred embodiment, and FIGS. 8A, 8B, 8C, 9A and 9B are perspective views showing the method in the second preferred embodiment.

DESCRIPTION OF THE PREFERRED EMBODIMENTS

Before explaining a method for making an optical semiconductor element in the preferred embodiment, the aforementioned conventional method will be explained in FIGS. 1A to 3D.

Figure 1A:
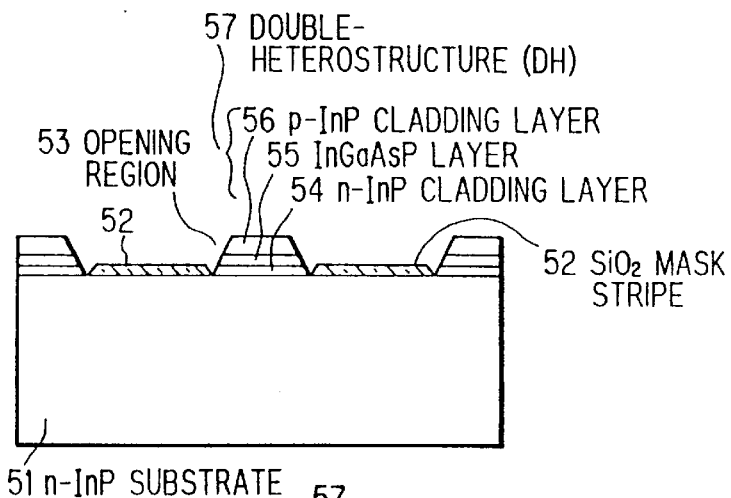
FIGS. 1A to 1D are cross sectional views showing a conventional method for making an optical semiconductor element.
Figure 1B:
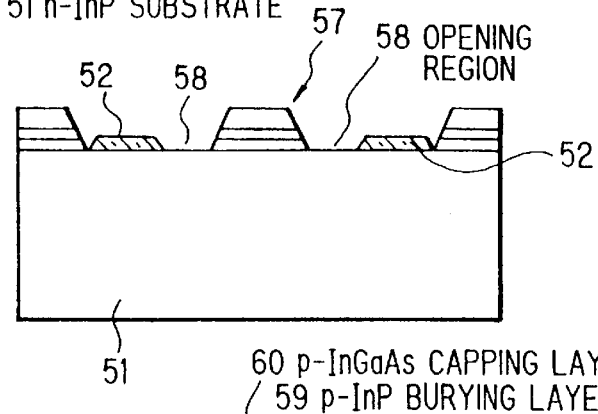
Figure 1C:
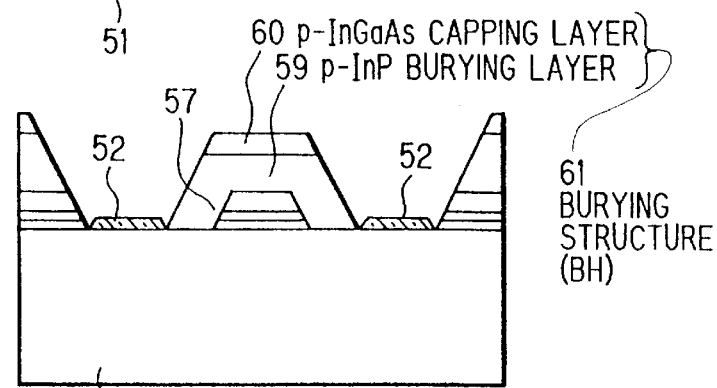
Figure 1D:
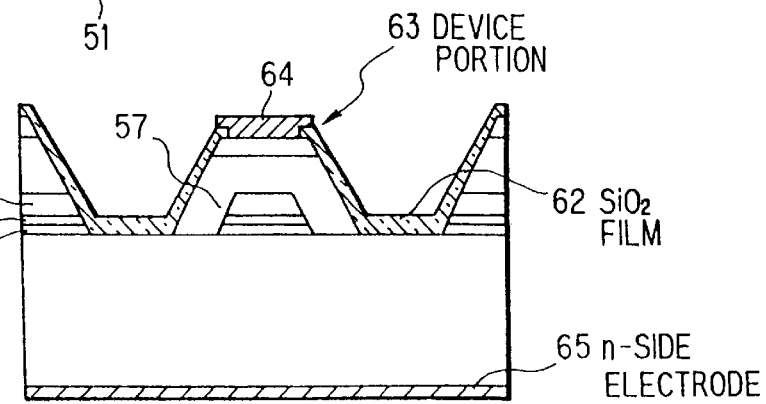

FIGS. 1A to 1D show the conventional method for making an optical semiconductor element in Japanese patent application laid-open No.4-303982. First, as shown in FIG. 1A, two silicon dioxide film mask stripes 52 (10 μm wide, 2 μm apart from each other) with an opening region 53 is formed on a (100) direction n-InP substrate 51 by the CVD and PR (photolithography) technique. Next, a n-InP cladding layer 54, an undoped InGaAsP light absorption layer 55 and p-InP cladding layer 56 are selectively grown by the MOVPE method to provide a double-heterostructure (DH) portion 57. Then, as shown in 1B, the silicon dioxide film mask stripes 52 are remove 4 μm at both sides of the DH portion 57 to form opening regions 58. Further, as shown in FIG. 1C, a p-InP burying layer 59 and p-InGaAs capping layer 60 are selectively grown to form a burying portion (hereinafter referred to as "BH" portion) 61. Finally, as shown in FIG. 1D, silicon dioxide film 62 is formed on the whole surface and only the silicon dioxide film 62 on the top surface of the BH portion 61 is removed to form a stripe about 7 μm wide on which a p-electrode 64 and n-electrode are formed to provide an optical modulator. Herein, the entire film thickness of the regions outside of the silicon dioxide film 52 (away from the DH portion) is greater than that of the device portion 63. This is caused by the fact that the burying layer on the regions outside of the silicon dioxide film 52 (away from the DH portion) is grown from a portion comprising a n-InP layer 66, an undoped InGaAsP layer 67 and a p-InP layer 68 whereas the burying layer on the DH portion is grown from the surface of the n-InP substrate 51 where the silicon dioxide film mask stripes 52 are partially removed. For example, when the mask is 8 μm wide and 2 μm is removed, the difference between both the film thicknesses (on the device portion 63 and the other portions) is about 250 nm which corresponds to about a half of the film thickness of the DH portion 57 itself.

Figure 2A:
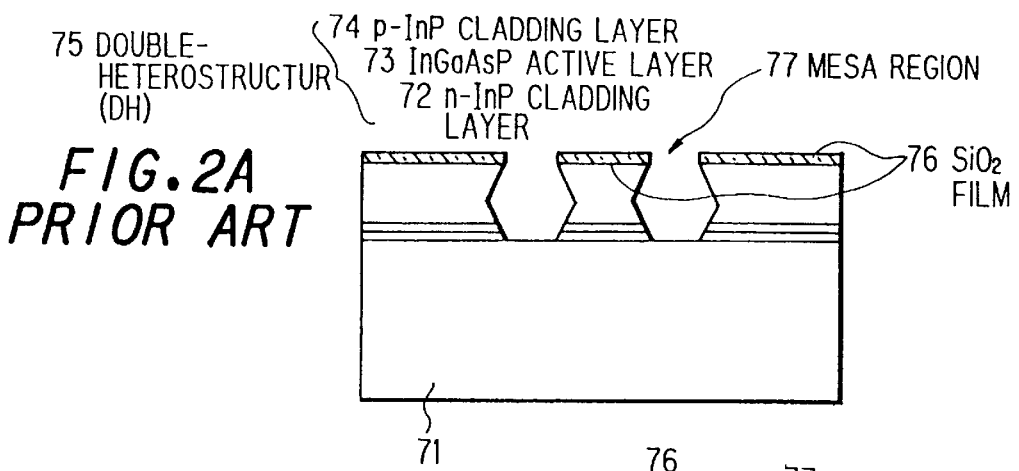
FIGS. 2A to 2D are cross sectional views showing another conventional method for making an optical semiconductor element.
Figure 2B:
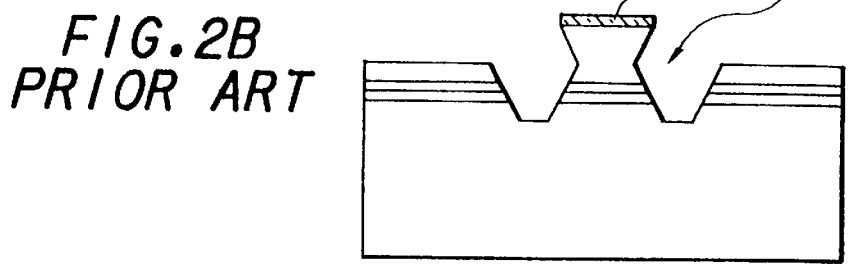
Figure 2C:
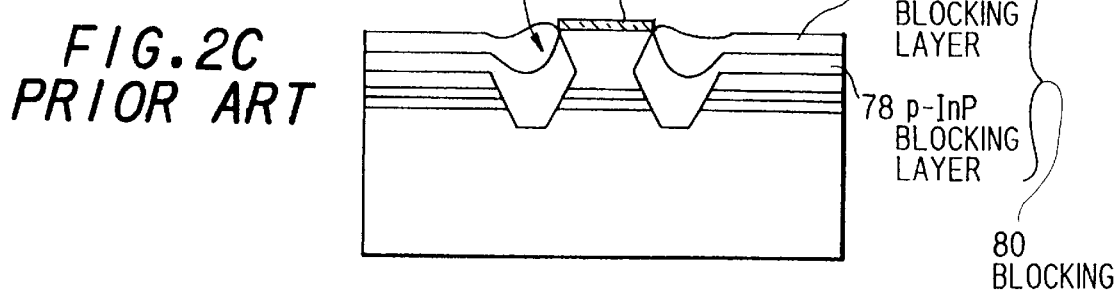
Figure 2D:
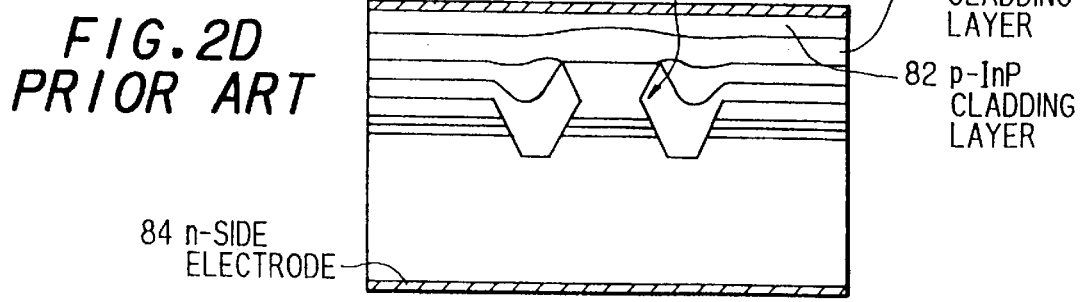

FIGS. 2A to 2D show the conventional method for making an optical semiconductor element in Japanese patent application laid-open No.01-007586 in which a difference in film thickness is provided before the growth of a burying layer. As shown in FIG. 2A, a DH portion 75 which comprises a n-InP cladding layer 72, an undoped InGaAsP active layer 73 and p-InP cladding layer 74 is first formed on a n-InP substrate 71. Next, silicon dioxide film 76 is formed thereon and then the silicon dioxide film 76 is removed to form two stripes thereon by PR technique. Further, the DH layer is etched to about 2 μm deep by using an etchant to form channels. Then, as shown in FIG. 2B, the silicon dioxide film 76 is remove except on a mesa region 77 and the regions outside the channels is etched by the etchant to a height about 2 μm lower than the mesa region. The height of the channel bottoms is 2 μm lower than the height of the regions outside the channels. Thereafter, as shown in FIG. 2C, a blocking layer 80 which comprises a p-InP blocking layer 78 and a n-InP blocking layer 79 is selectively grown to make the top levels of the mesa region and blocking layer equal. Finally, as shown in FIG. 2D, the silicon dioxide film 76 is removed and a burying layer is then grown on the whole surface to provide a plane surface. Herein, 81 is a p-InP cladding layer, 82 is a p-InGaAa capping layer, 83 is a p-side electrode and 84 is a n-side electrode.

Figure 3A:
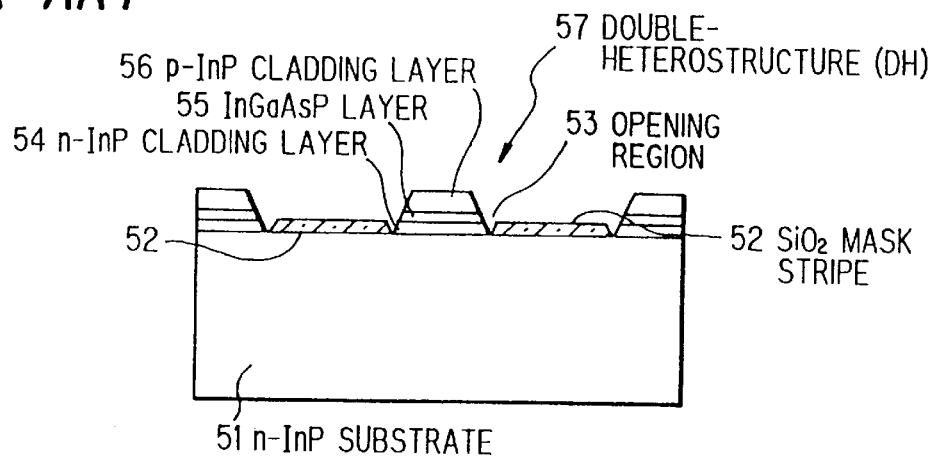
FIGS. 3A to 3D are cross sectional views showing a method suggested by the conventional method in FIGS. 2A to 2D.
Figure 3B:
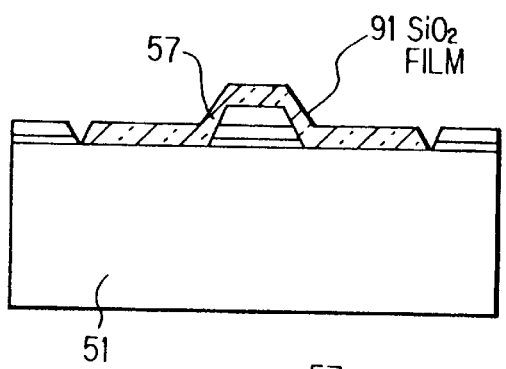
Figure 3C:
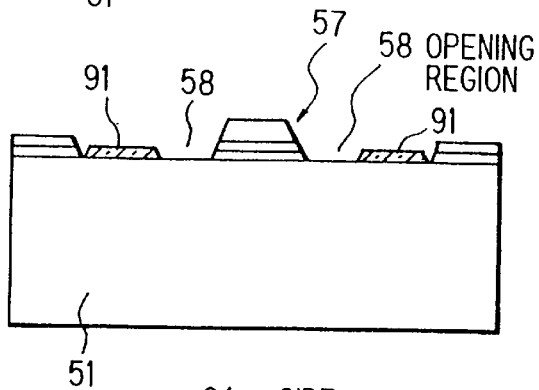
Figure 3D:
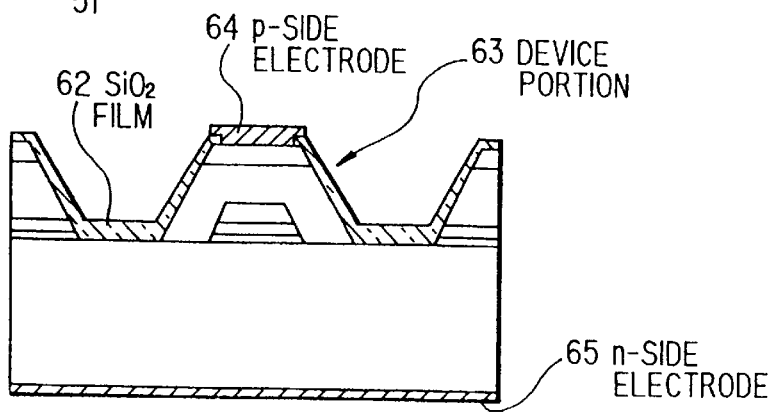

FIGS. 3A to 3D show a method suggested by the conventional methods in Japanese patent application laid-open Nos.4-303982 and 01-007586. Herein, FIG. 3A corresponds to FIG. 1A. Then, as shown in FIG. 3B, silicon dioxide film 91 is formed on the whole surface and the silicon dioxide film 91 is then removed at the regions outside the silicon dioxide film mask stripes 52, thereafter etching the exposed portion to about 300 nm. Next, as shown in FIG. 3C, the silicon dioxide film 91 is removed on the DH portion 57 and 4 μm at both sides of the DH portion 57. The film thickness of the silicon dioxide film 91 is 350 nm to be less than a critical thickness. The processes thereafter are similar to those in FIGS. 1C and 1D. When the growth of a burying layer is complete, the film thickness of the regions outside the silicon dioxide film mask stripes 52 (between the device portion 63 and other portions) is about 50 nm thinner than that of the device portion 63, as shown in FIG. 3D.

Figure 4:
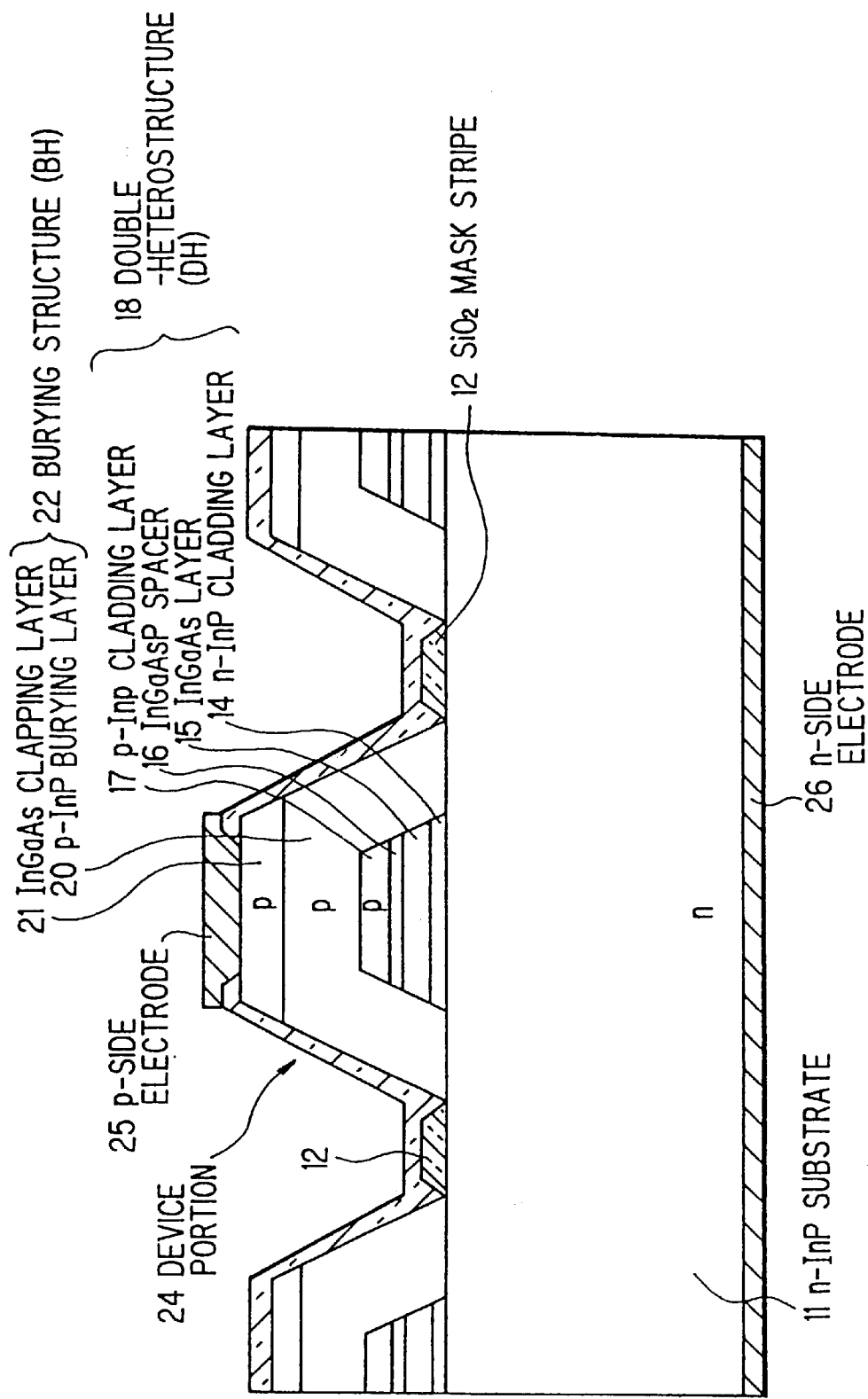
FIG. 4 is a cross sectional view showing an optical semiconductor element obtained by a method for making an optical semiconductor element in a first preferred embodiment according to the invention.
Figure 5A:
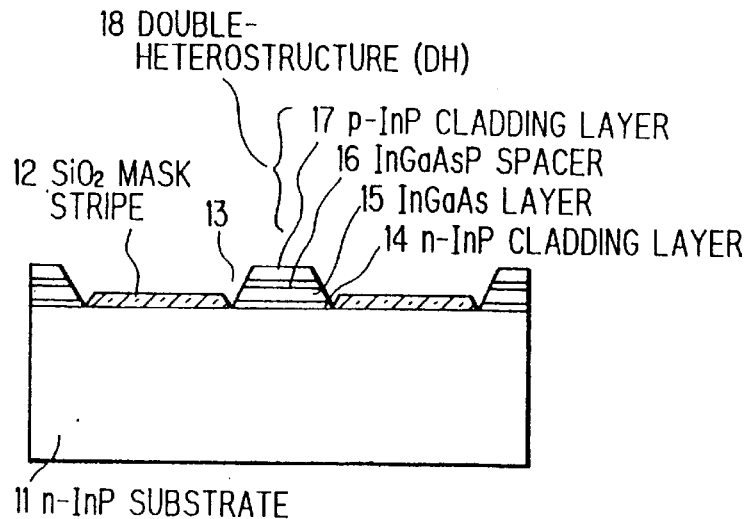
FIGS. 5A to 5D are cross sectional views showing the method for making an optical semiconductor element in the first preferred embodiment according to the invention.
Figure 5B:
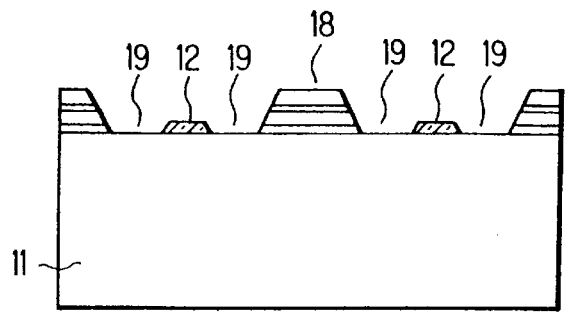
Figure 5C:
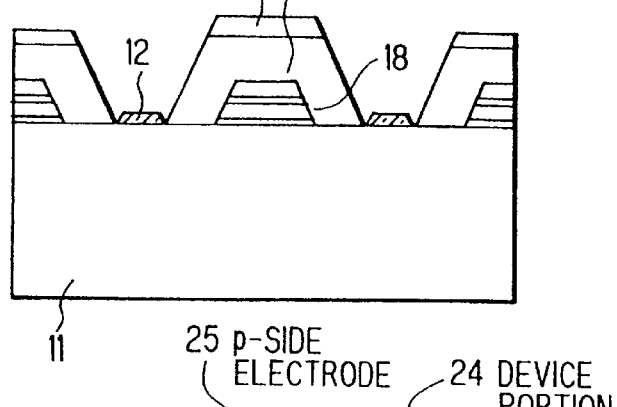
Figure 5D:
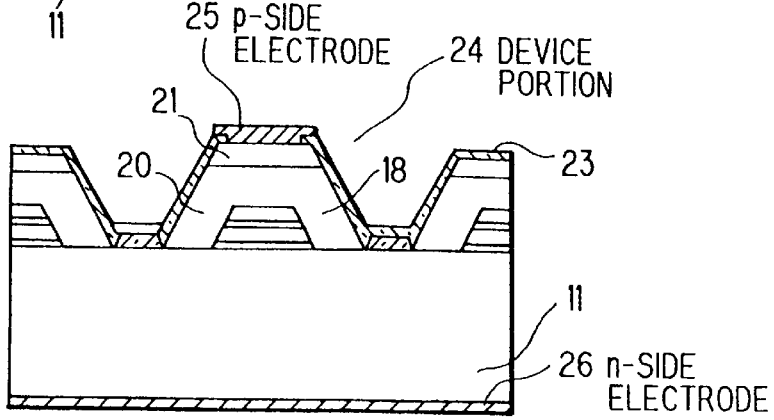

A method for making an optical semiconductor element in the first preferred embodiment will be explained in FIGS. 4 to 5D, wherein FIG. 4 shows a cross sectional view of a semiconductor optical modulator to be fabricated by the method of the invention and FIGS. 5A to 5D show processes of the method.

As shown in FIG. 4, the semiconductor optical modulator comprises a n-InP substrate 11, silicon dioxide film mask stripe 12 selectively formed on the surface thereof, a device portion 24 including a double-heterostructure (DH) portion 18, silicon dioxide film 23 which covers the whole surface of the element except the top surface of the device portion 24, p-electrode 25 and n-electrode 26.

Herein, the DH portion 18 comprises a n-InP cladding layer 14, and undoped InGaAsP light absorption layer 15, an undoped InGaAsP spacer layer 16 and a p-n-InP cladding layer 17. The device portion 24 comprises p-InP burying layer 20 covering the DH portion 18 and a p-InGaAs capping layer 21.

As shown in FIG. 4, the film thickness outside of the silicon dioxide film mask stripe 12 (outside device portion 24) is less than that of the device portion 24. Therefore, the contact exposure for forming electrodes can be precisely performed since the top surface of the device portion is contacted securely with a glass mask.

The method for making the semiconductor optical modulator in FIG. 4 will be explained in FIGS. 5A to 5D.

First, as shown in FIG. 5A, the silicon dioxide film mask stripes 12 (8 μm in width, 350 nm in thickness) with a 1.5 μm wide opening region 13 is formed on the n-InP substrate 11 by the thermal CVD method and PR technique. Next, the DH portion 18 which comprises the n-InP cladding layer 14 (carrier concentration of $5 \times 10^{17}$ cm$^{-3}$, 100 nm in thickness), the undoped InGaAsP light absorption layer 15 (wavelength composition of 1,470 μm, 250 nm in thickness), the undoped InGaAsP spacer layer 16 (50 nm in thickness) and a p-n-InP cladding layer 17 (carrier concentration of $5 \times 10^{17}$ cm$^{-3}$, 100 nm in thickness) is selectively grown at the opening region 13 by the MOVPE (metal organic vapor phase epitaxy) method.

Then, as shown in FIG. 5B, the silicon dioxide film mask stripes 12 are chemically etched to be removed about 2 μm at both sides of the DH portion 18 and opposite sides thereof to form opening regions 19. Then, as shown in FIG. 5C, BH portion 22 which comprises p-InP burying layer 20 (carrier concentration of $5 \times 10^{17}$ cm$^{-3}$, 1.5 μm in thickness) and a p-InGaAs capping layer 21 (0.2 μm in thickness) is selectively grown by the MOVPE method.

Finally, as shown in FIG. 5D, silicon dioxide film 23 (150 nm in thickness) is formed on the whole surface and the silicon dioxide film on the top surface of the device portion 24 is then removed by the contact exposure method with a glass mask (not shown) to form a stripe about 2 μm wide, thereafter forming the p-electrode 25 and n-electrode 26 thereon to provide the optical modulator in FIG. 4.

In the first embodiment, the width of the opening 19 from which the moved silicon dioxide film has been removed in the process in FIG. 5B is 2 μm at both sides of the DH portion 18 and the opposite sides thereof. Herein, with regard to the difference in the film thickness between the device portion 24 and the region outside of the silicon dioxide film mask stripe (away from the device portion 24), the conventional method in FIG. 1 in which the silicon dioxide film is etched only at both sides of the DH portion (at opening portions 58) is compared with the method in this embodiment. As a result, in the first embodiment, the difference in the film thickness between the device portion 24 and the region outside of the silicon dioxide film mask stripe 12 (away from device portion 24) is not equal to the thickness of the DH portion 18 but about a half (250 nm) thereof.

This is because the growth speed in the device portion 24 is greater than that in the region outside of the silicon dioxide film mask stripe 12 due to the diffusion of material in vapor phase on the silicon dioxide film mask stripe 12. Namely, when the widths of opening regions 19 at both sides of the silicon dioxide film mask stripe 12 are set to be equal, the film thickness of the device portion 24 must be greater than that of the region outside of the silicon dioxide film mask stripe 12 (away from device portion 24) due to the difference in the growth speed. Therefore, it is suitable that the widths of opening regions at both sides of the silicon dioxide film mask stripe 12 are set to be about equal.

Accordingly, if the widths of the opening regions 19 are thus set equal, the film thickness in the device portion 24 is, as shown in FIG. 4, greater than that in the region outside of the silicon dioxide film mask stripe 12 (away from the device portion 24), thereby securely contacting the device portion 24 with the glass mask when the contact PR process for forming electrodes is thereafter carried out. As a result, the product yield can be significantly improved.

Figure 6:
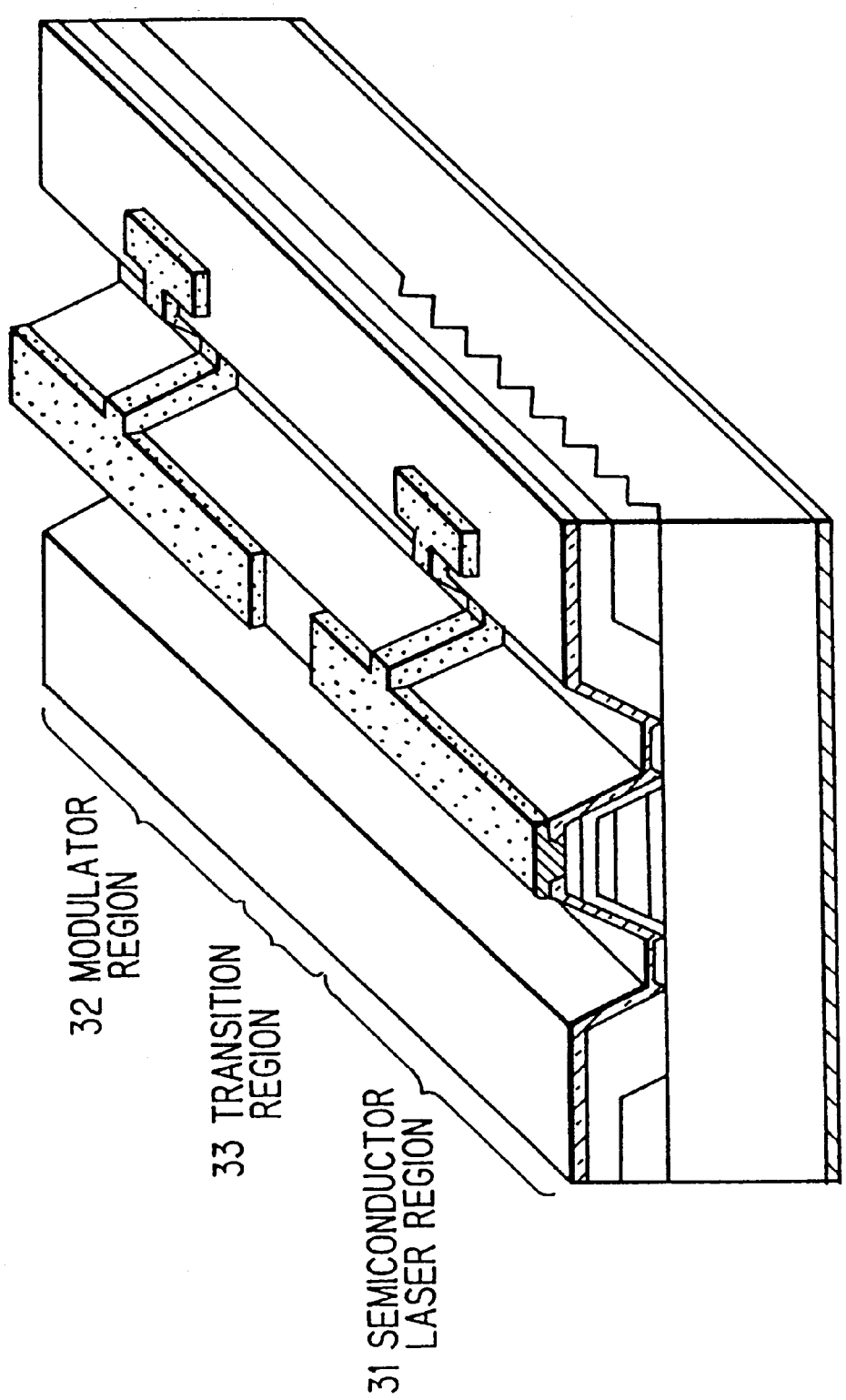
FIG. 6 is a perspective view showing an optical semiconductor element obtained by a method for making an optical semiconductor element in a second preferred embodiment according to the invention.

Next, a method for making an optical semiconductor element in the second preferred embodiment will be explained in FIGS. 6 to 9B., wherein FIG. 6 shows a perspective view of a semiconductor integrated element which comprises a semiconductor laser region 31, an optical modulator region 32 and a transition region 33 therebetween to be fabricated by the method. By utilizing that method, as shown in the first embodiment, the growth layer and film thickness can be controlled by a mask width, MQW (multiquantum well) structure is selectively grown on a substrate with varied mask stripe width to integrally form a semiconductor laser active layer and an optical modulator light absorption layer which have different bandgap energies.

In such an element, it should be noted that the difference in film thickness between the semiconductor laser region 31 and optical modulator region 32 exists as well as the difference in film thickness between the device region and the region outside of the silicon dioxide film mask stripe. The film thickness of the device portion can be made the thickest by controlling the etching width of the silicon dioxide film before growing the burying layer.

FIGS. 7A and 7B show mask patterns of silicon dioxide film used for the method in the second embodiment. As shown in FIG. 7A, a semiconductor laser active layer and optical modulator light absorption layer are integrally grown in an opening region 42 by using a pattern with varied mask width. For example, the mask widths are 18 μm in the semiconductor laser region 31 and 8 μm in the optical modulator region 32, and the width of the opening region 42 is 1.5 μm.

Then, as shown in FIG. 7B, the width of silicon dioxide film 41 is reduced to 4 μm to form a straight mask. Herein, the opening widths to the optical modulator region 32 are about 2 μm at both the opening regions 43 and the opposite opening regions 44. The opening widths to the semiconductor laser region 31 are about 2 μm at the opening regions 43 and about 12 μm at the opposite opening regions 44.

Figure 8A:
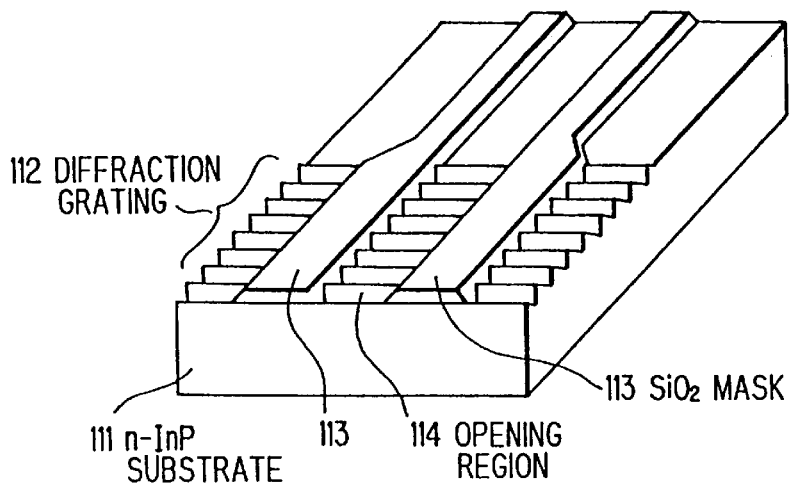

The method for making the optical semiconductor element in the second preferred embodiment will be explained in FIGS. 8A to 9B. First, as shown in FIG. 8A, on a n-InP substrate 111 on which a diffraction grating is partially formed, a pair of silicon dioxide film mask stripes 113 (350 nm is thickness) with an opening region 114 (1.5 μm in width) are formed by the thermal CVD and PR technique.

Figure 8B:
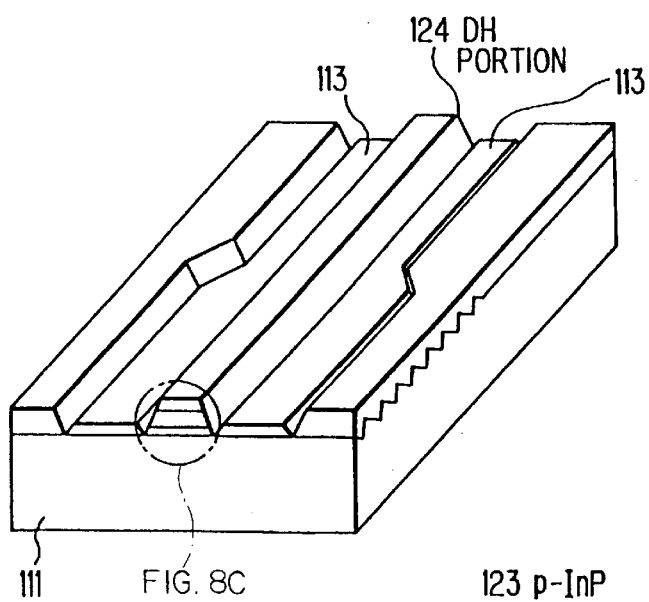
Figure 8C:
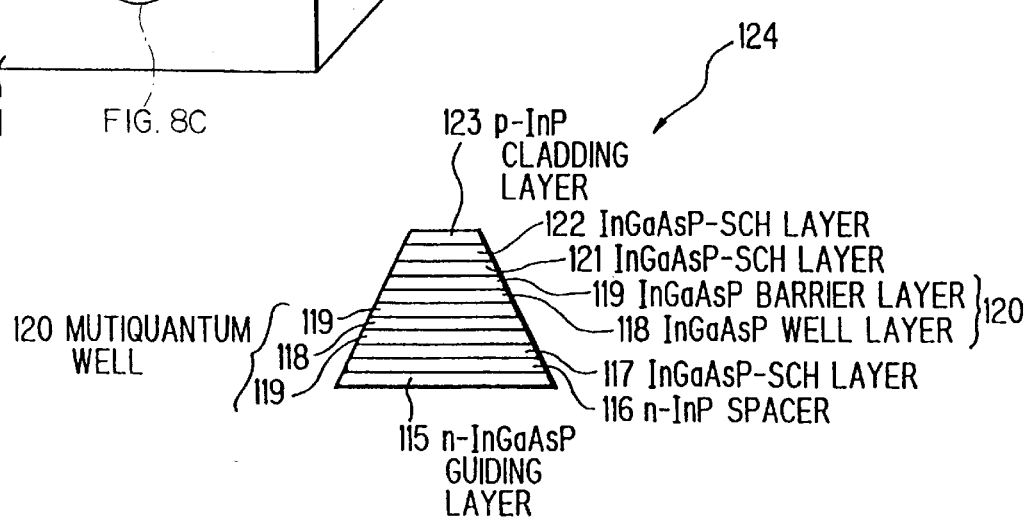

Then, as shown in FIG. 8B, on the opening region 114, a DH portion 124 which comprises a n-InGaAsP guiding layer 115 (wavelength composition of 1.130 μm, carrier concentration of $5 \times 10^{17}$ cm$^{-3}$ and thickness of 10 nm, a n-InP spacer layer 116 (carrier concentration of $5 \times 10^{17}$ cm$^{-3}$ and thickness of 30 nm), and undoped InGaAsP-SCH layer 117 (wavelength composition of 1.130 μm, thickness of 40 nm), a five-layer MQW 120 comprising an undoped InGaAsP well layer 188 (wavelength composition of 1.550 μm, thickness of 5 nm) and undoped InGaAsP barrier layer 119 (wavelength composition of 1.130 μm, thickness of 10 nm), and undoped InGaAsP-SCH layer 121 (wavelength composition of 1.130 μm, thickness of 60 nm), an undoped InGaAsP-SCH layer 122 (wavelength composition of 1.050 μm, thickness of 40 nm), and a p-InP cladding layer 123 (carrier concentration of $5 \times 10^{17}$ cm$^{-3}$ and thickness of 150 nm) is selectively grown by the MOVPE method.

Therefore, as shown in FIG. 9A, the silicon dioxide film mask stripes 113 at both sides of the DH portion 124 are chemically etched to be formed as in FIG. 7B to provide opening regions 125 and 126. Then, as shown in FIG. 9B, a BH portion 129 which comprises p-InP burying layer 127 (carrier concentration of $5 \times 10^{17}$ cm$^{-3}$ and thickness of 1.5 μm) and p-InGaAs capping layer 128 (thickness of 0.2 μm) is selectively grown by the MOVPE method.

Finally, as shown in FIG. 6, silicon dioxide film 131 (150 nm in thickness) is formed on the whole surface and the silicon dioxide film on the top surface of the device portion 130 is then removed by the contact exposure method with a glass mask(not shown) to form a stripe about 2 μm wide, thereafter forming the p-electrode 132 and n-electrode 133 thereon to provide the semiconductor integrated element.

In the second embodiment, the film thickness of the regions outside the opening regions 126 after growing the burying layer is less than that of the device portion 130, thereby securely contacting the glass mask for the contact PR treatment with the device region.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A method for making an optical semiconductor element, comprising the steps of:
   forming two growth-blocking mask stripes of silicon dioxide film on a first conductivity type compound semiconductor substrate;
   selectively forming a double-heterostructure which comprises:
   a first conductivity type cladding layer;
   a light absorption layer; and
   a second conductivity type cladding layer on a mask opening region by a metal organic vapour phase epitaxy method;
   partially removing said mask stripes on both sides of said double-heterostructure and on opposite sides of said mask stripes thereof to provide further opening regions; and
   forming a device portion by selectively forming a burying structure on said double-heterostructure by the metal organic vapour phase epitaxy method such that a thickness of said device portion is greater than a thickness in a region on opposite sides of said mask stripes from said device portion.

2. A method for making an optical semiconductor element, according to claim 1, further comprising the step of:
   forming an electrode on said burying structure by the contact exposure method.

3. A method for making an optical semiconductor element, according to claim 1, wherein:
   said semiconductor element is a semiconductor optical modulator.

4. A method for making an optical semiconductor element, according to claim 2, wherein:
   said semiconductor element is a semiconductor optical modulator.

5. A method for making an optical semiconductor element, comprising the steps of:
   forming two growth-blocking mask stripes of silicon dioxide film, said mask stripes longitudinally comprising:
   a first width region;
   a second width region with a width greater than said first width region; and
   a tapered third width region extending between said first and second width regions on a first conductivity type compound semiconductor substrate;
   selectively forming a double-heterostructure which comprises:
   a first conductivity type cladding layer;
   a light absorption layer; and
   a second conductivity type cladding layer on a mask
   partially removing said mask stripes on both sides of said double-heterostructure and on opposite sides of said mask stripes thereof to provide further opening regions;
   forming a device portion by selectively forming a burying structure on said double-heterostructure by the metal organic vapour phase epitaxy method such that a thickness of said device portion is greater than a thickness in a region on opposite sides of said mask stripes from said device portion; and
   forming an electrode on said burying structure by the contact exposure method.

6. A method for making an optical semiconductor element, according to claim 5, wherein:
   said first width region is a semiconductor optical modulator, said second width region is a semiconductor laser element and said third width region is a transition region.

* * * * *